US011417527B2

(12) United States Patent
Katsunuma

(10) Patent No.: US 11,417,527 B2
(45) Date of Patent: Aug. 16, 2022

(54) METHOD AND DEVICE FOR CONTROLLING A THICKNESS OF A PROTECTIVE FILM ON A SUBSTRATE

(71) Applicant: Tokyo Electron Limited, Tokyo (JP)

(72) Inventor: Takayuki Katsunuma, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/005,401

(22) Filed: Aug. 28, 2020

(65) Prior Publication Data

US 2022/0068645 A1 Mar. 3, 2022

(51) Int. Cl.
| | |
|---|---|
| *H01L 21/033* | (2006.01) |
| *H01L 21/311* | (2006.01) |
| *H01J 37/32* | (2006.01) |
| *C23C 16/455* | (2006.01) |
| *C23C 16/04* | (2006.01) |
| *C23C 16/56* | (2006.01) |

(52) U.S. Cl.
CPC ........ *H01L 21/0337* (2013.01); *C23C 16/042* (2013.01); *C23C 16/45536* (2013.01); *C23C 16/45553* (2013.01); *C23C 16/56* (2013.01); *H01J 37/32091* (2013.01); *H01J 37/32449* (2013.01); *H01J 37/32834* (2013.01); *H01L 21/31116* (2013.01); *H01L 21/31144* (2013.01); *H01J 2237/332* (2013.01); *H01J 2237/334* (2013.01)

(58) Field of Classification Search
CPC ........... H01L 21/0337; H01L 21/31144; H01L 21/31116; C23C 16/45536; C23C 16/042; C23C 16/45553; C23C 16/56; H01J 37/32091; H01J 37/32449; H01J 2237/334; H01J 2237/332
USPC ....... 438/304, 639, 706, 712, 714, 717, 719, 438/736, 758
See application file for complete search history.

(56) References Cited

U.S. PATENT DOCUMENTS

| | | | |
|---|---|---|---|
| 2009/0191711 A1* | 7/2009 | Rui | H01J 37/3266 438/695 |
| 2014/0273462 A1* | 9/2014 | Simsek-Ege | H01L 29/66825 438/696 |
| 2016/0343580 A1 | 11/2016 | Hudson | |
| 2017/0178920 A1* | 6/2017 | Dole | H01L 21/31116 |
| 2018/0174858 A1 | 6/2018 | Hudson | |

* cited by examiner

*Primary Examiner* — Lan Vinh
(74) *Attorney, Agent, or Firm* — Xsensus LLP

(57) ABSTRACT

A method of forming a film on a substrate that includes an etching layer and a mask formed on the etching layer. The method comprises (a) exposing the substrate, in a reaction chamber, to a precursor to dispose precursor particles on at least a sidewall of a recess in the etching layer; (b) supplying an inhibitor gas and a modification gas to the reaction chamber to generate a plasma; and (c) modifying the precursor particles on the sidewall into a protective film while the inhibitor gas and the modification gas are supplied in the reaction chamber.

20 Claims, 11 Drawing Sheets

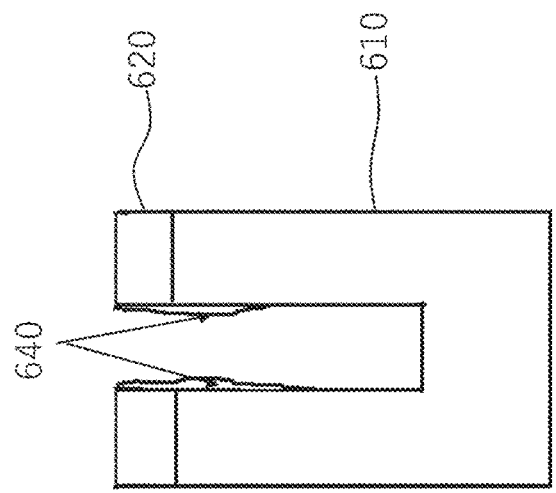

FIG. 7A

METHOD AND DEVICE FOR CONTROLLING A THICKNESS OF A PROTECTIVE FILM ON A SUBSTRATE

TECHNICAL FIELD

The present disclosure relates to the etching of substrates. More particularly, the disclosure relates to methods devices that protect a sidewall of a recess with a protective film as part of an etching process to form the recess with a high aspect ratio.

BACKGROUND

Semiconductor fabrication methods have improved with the introduction of new technologies, and as a consequence, the size of integrated circuits (ICs, microelectronic circuits, microchips, or simply "chips") fabricated as a single unit, as well as the feature sizes of components on the IC have also reduced. Miniaturized active and passive semiconductor devices, as well as interconnections are fabricated on a semiconductor substrate (e.g., silicon). To form the ICs, the substrate is subjected to numerous processes, such as doping, ion implantation, etching, thin-film deposition of various materials, and photolithographic patterning. Finally, the individual microcircuits are separated by dicing and then individually packaged as ICs.

Particular process steps employed in forming ICs on a substrate include Atomic Layer Deposition (ALD), Chemical Vapor Deposition (CVD) and Atomic Layer Etching (ALE). In a certain conventional process, an etching condition is changed according to a depth of a formed pattern. For example, in some conventional process, chamber pressure, RF power, flow ratio of the process gases are changed according to the depth of the formed pattern.

The deterioration of a shape, such as bowing, of a sidewall due to side etching (or lateral etching) is a problem in conventional etching processes. Conventionally, a protective film is formed on a sidewall of an etched recess using an ALD process, CVD process, or other process. When the protective film is formed to have a uniform thickness large enough to suppress lateral etching, the opening of a mask pattern decreases in size which leads to the opening becoming clogged. Alternatively, when the protective film is formed by a sub-conformal ALD process (that has a thicker film thickness at the upper portion than the lower portion) in the region where the recess is susceptible to lateral etching, the opening of a mask pattern decreases in size which leads to the opening becoming clogged.

SUMMARY

According to an embodiment, a method of forming a film on a substrate that includes an etching layer and a mask formed on the etching layer. The method comprises (a) exposing the substrate, in a reaction chamber, to a precursor to dispose precursor particles on at least a sidewall of a recess in the etching layer; (b) supplying an inhibitor gas and a modification gas to the reaction chamber to generate a plasma; and (c) modifying the precursor particles on the sidewall into a protective film while the inhibitor gas and the modification gas are supplied in the reaction chamber.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings.

FIGS. 6A to 6C illustrate an etched recess when a protective film of a sub-conformal ALD is used according to an embodiment of the present disclosure.

FIGS. 7A to 7C are exemplary timing charts for the formation of a protective film.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can and do cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Additionally, it is to be understood that terms such as "left," "right," "top," "bottom," "front," "rear," "side," "height," "length," "width," "upper,"

"lower," "interior," "exterior," "inner," "outer," and the like that may be used herein, merely describe points of reference and do not necessarily limit embodiments of the disclosed subject matter to any particular orientation or configuration. Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

The present disclosure uses "recess" as a type of etched feature throughout the present disclosure, and the two terms (recess and etched feature) will be used interchangeably herein. Moreover, the term "recess" is not limiting, and could be a hole, slit, groove, concave void or other type of engraved pattern in the substrate material being etched.

Figure 1:
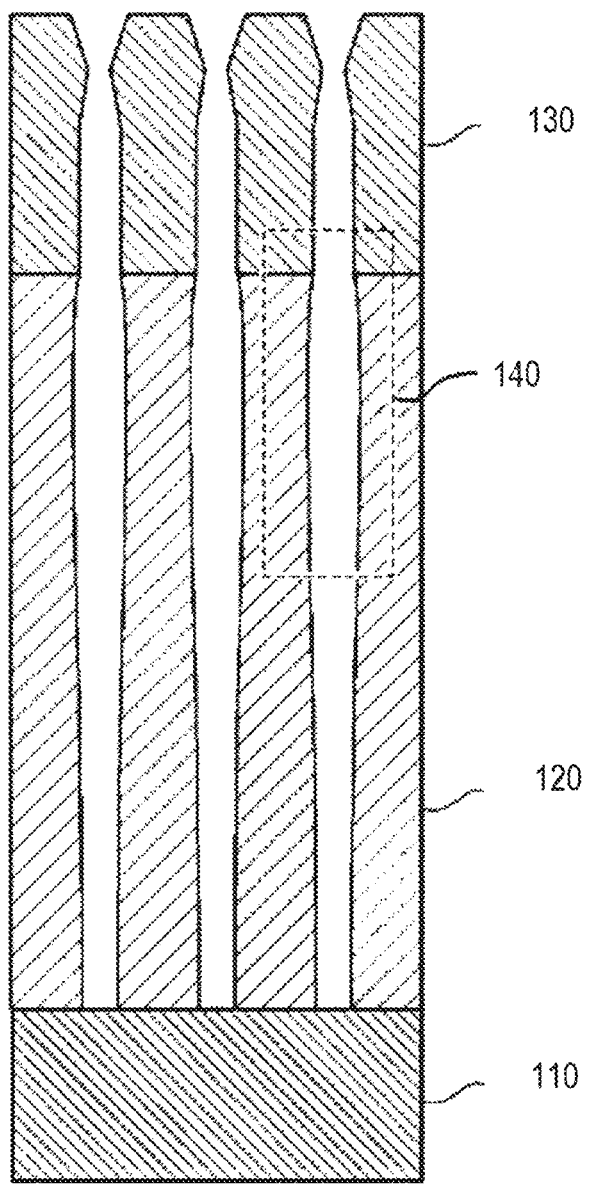
FIG. 1 illustrates an etched recess that experiences bowing of its sidewalls.

The present inventors recognized that performing high aspect ratio (HAR) etching while reducing a "bowing" effect on the sidewalls of a recess, becomes increasingly more difficult as the dimensions of a stacked structure become increasingly extended. For example, in a 3D NAND, a stack structure is formed of alternating film depositions, often alternating SiO and SiN layers. The stack resembles somewhat of a skyscraper with many memory cells formed on each floor, and many floors in the skyscraper. Deep etching is needed to define channels between cells, and ideally the etch is of uniform hole size for all layers in the stack. If not done properly, a lack of uniformity of particular holes takes various forms, including bowing, as shown in region 140 of the stack 100 in FIG. 1. The bowing is a consequence of over-etching of sidewalls, especially at the upper portion of etching layer 120. The bowing may be a consequence of ion scatter from faceted edges of a mask that has been exposed to significant etch time. Although ion in a HAR are oriented in a highly rectilinear fashion, some of the ions ricochet off the faceted edges of the mask, and thus are sent into the sidewall in region 140. Moreover, as shown in FIG. 1, a mask (amorphous carbon layer) 130 is disposed over etching layer 120, which in turn is formed on substrate 110. As a consequence of resist mask facet angle, over-etching of sidewalls at the upper portion of the etching layer 120 gives rise to bowing in the critical dimension (CD) of a recess, which in turn leads to non-uniformity of the critical dimension along an entirety of a depth of the hole. This bowing is therefore to be avoided so consistency in memory cell viability and performance can be maintained. In this discussion, CD refers to a diameter of a recess, but may also include space CD in a line and space structure (groove) of the recess as well.

Conventional apparatus form a recess in a substrate by a repeatable deposition and etching process. The process begins by etching the substrate. Fluorine containing gas is routinely used during the etching step. In the present application, a Fluorine containing gas may be, for example, a CxFy gas such as CF4, C4F6, or C4F8, or may be NF3 or SF6. However, the Fluorine containing gas may be another gas that includes Fluorine.

After etching of the substrate is stopped, a protective film is formed on sidewalls of the recess. Precursor adsorption and modification are repeated a number of times in order to form a protective film having a desired thickness. In order to get the protective film to penetrate deep into the recess, a precursor with a low sticking coefficient is used. Chemical reactants such as malonyl chloride and ethylenediamine may be used to form the protective film. After the protective film has been deposited, etching is continued, and the cycle is repeated until the recess is completed. In the present application, a precursor may include, for example, amino-silane or another silicon (Si) containing component. For clarity, although Si is used as an exemplary precursor component in many places in this document, it should be understood that precursor components other than, or in addition to, Si are also intended as viable precursor components that adsorb to the substrate surfaces, such as the sidewalls. Moreover, the present teachings are not intended to be limited to Si as the only precursor component.

The present inventors recognized that conventional substrate processing techniques have several limitations. Conventional techniques for etching a substrate involve repeating deposition and etching steps until a recess in the substrate is complete. Moreover, deposition steps in conventional ALD or conventional sub-conformal ALD processes for suppressing bowing in the sidewall result in a protective film that has a film thickness that is thicker in an upper region of the recess, which can decrease a size of the opening of the mask pattern, e.g. the opening becomes clogged.

To address the limitations of conventional techniques, the present inventors have developed apparatuses and processes to control (restrict) a film formation amount (thickness distribution of a protective film) in a recess part in an ALD process or unsaturated (sub-conformal) ALD process. By controlling (restricting) the film formation amount, a thickness of the protective film is suppressed at an opening of the mask compared to other part of the recess in the etching layer. As a result, the opening of the mask is not clogged during or after deposition of the protective film.

The present inventors have recognized and developed processes to control the film formation amount in the recess. In one embodiment, this is accomplished in a series of steps starting with adsorbing a first gas, also referred to as a precursor, onto surfaces of the substrate. The precursor may be a silicon (Si) containing gas, and is supplied into a reaction chamber in which the substrate is placed. In particular, a precursor component, such as Si, which is a component of a Si-containing gas, of the first gas adsorbs onto substrate surfaces. The first gas may be applied for a first time period.

Further, a modification gas (also referred to as a reaction gas) is introduced, after the precursor is adsorbed. The modification gas may be supplied into the recess. This modification gas, such as an oxygen-containing gas (e.g., O* radical) is supplied into the reaction chamber. A plasma is generated from the modification gas and the adsorbed precursor is exposed to the plasma to drive a surface reaction to form a protective film on sidewalls of the recess. The oxygen-containing gas may include $O_2$, CO, $CO_2$, $O_3$, or the like, but this list is not limiting. Additionally, the modification gas may be an N-containing gas, such as $NH_3$, $N_2$, $NF_3$ or the like, but these examples are not limiting is not limiting.

Alternatively, in forming a sub-conformal ALD, the precursor is adsorbed onto only a portion of the surface of the substrate. The modification gas is introduced thereafter and forms a film only in the portion onto which the precursor has been adsorbed. Specifically, for example, the precursor may be supplied in a relatively short time, and a pressure and a flow rate may be reduced relative to a standard process time. Supply of the precursor and the modification gas constitute a first cycle of a hybrid gas application cycle, and a consequence of performing supplying the modification gas is that a protective film is formed on the sidewall of the recess, while the bottom part of the recess may be partially etched. In the case of using Si-containing gas as a precursor and an O* radical as the modification gas, the protective film that forms on the sidewall of the recess is $SiO_2$.

The present inventors recognized that by providing an inhibitor, such as a fluorine-containing gas, during modification of an ALD (and a sub-conformal ALD) process, a film formation amount at an opening of a mask may be reduced and that the clogging of the opening may be suppressed. In particular, fluorine of the F-containing gas adheres to a periphery of the mask opening, and hinders the adsorption of a precursor of a next iteration of the process. Thus, a thickness of the protective film may be gradually reduced along the sidewall of the recess so that the film formation amount at the opening of the mask is reduced and clogging at the opening is suppressed.

While numerous advantages effects are accomplished with the disclosed embodiments, the present inventors have recognized advantages of embodiments of the present disclosure. One advantage is that it becomes possible to form a protective film that is of a controlled thickness on the sidewall while forming a thinner protective film on the mask. The protective film on the sidewall may have a thickness that is gradually reduced with depth on the sidewall of recess. A reduction in a size of the mask opening is suppressed and the distribution of the protective film thickness is controlled, which leads to improved etching quality. It becomes possible to intentionally form a protective film to be relatively thick on a portion where lateral etching occurs and to be relatively thin at other locations where lateral etching is not an issue. Moreover, it becomes possible to broaden a diameter of a bottom of the recess by an over-etching while simultaneously suppressing bowing in an upper portion of the recess.

Figure 2:
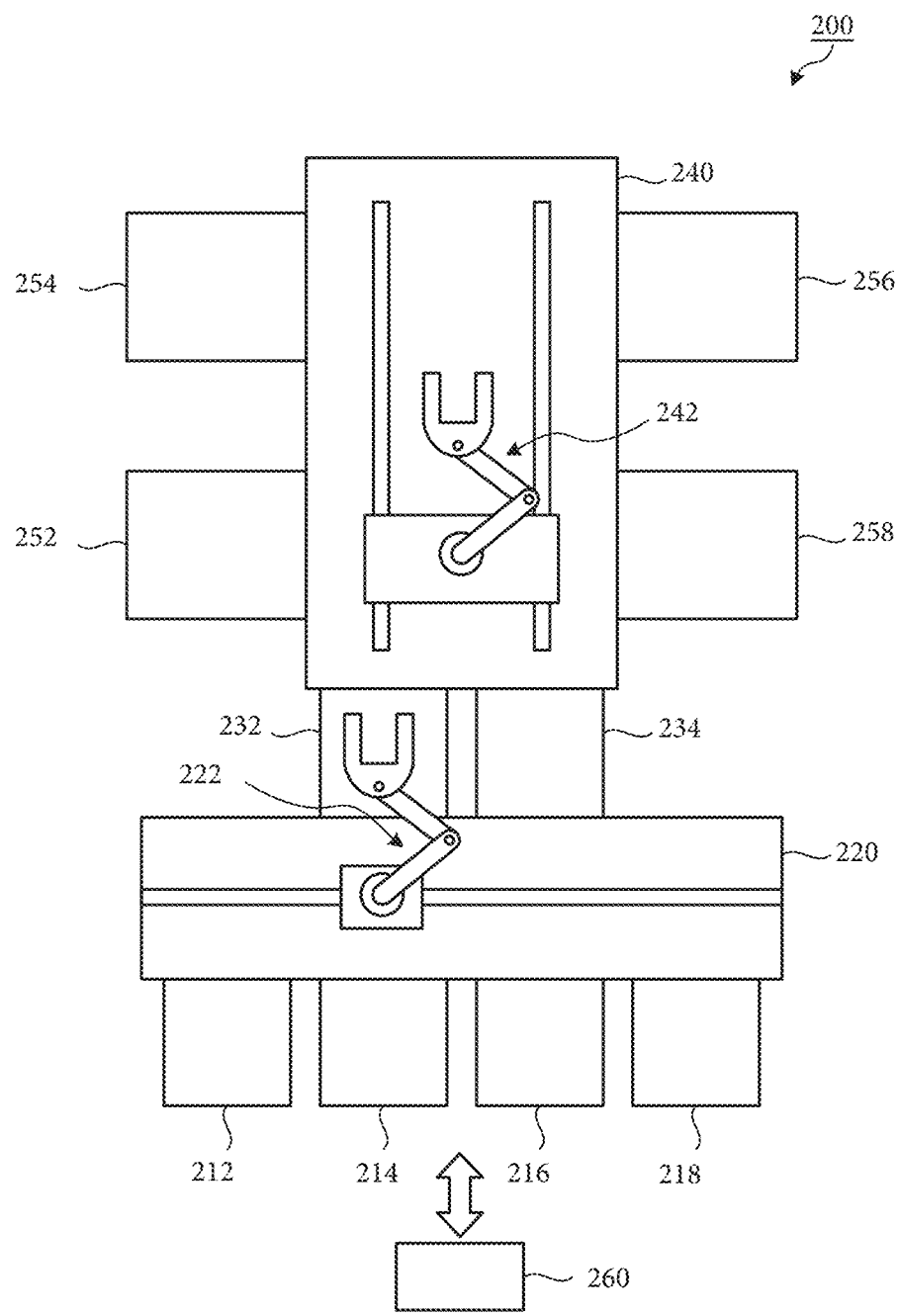
FIG. 2 illustrates an exemplary substrate processing system according to the present disclosure.

Moving onto the drawings, FIG. 2 illustrates substrate processing system 200 according to the present disclosure. Substrate processing system 200 includes transfer device 240 (that operates at a reduced pressure with respect to etching apparatuses 252, 254, 256, and 258) that includes a transfer robot 242 to transport a substrate W, to and from etching apparatuses 252, 254, 256, and 258. The transfer device 240 has a vacuum transportation chamber that interfaces with load lock chambers 232 and 234. The etching apparatuses 252, 254, 256 and 258 are connected to the transport device 240 and partitioned from load lock chambers 232 and 234.

Load lock chambers 232 and 234 provide a way to compartmentalize environments between the transfer device 240 and the loader device 220. The loader device 220 has a carrier placing table in which a carrier is placed. The carrier holds, for example, twenty five substrates W and when moved in and out of the substrate processing system 200 is placed on a front surface of the loader device 220. The loader robot 222 transports substrates between the carrier placing table and the load lock chambers 232 and 234. Carriers are exchanged in respective load ports 212-218.

Figure 4:
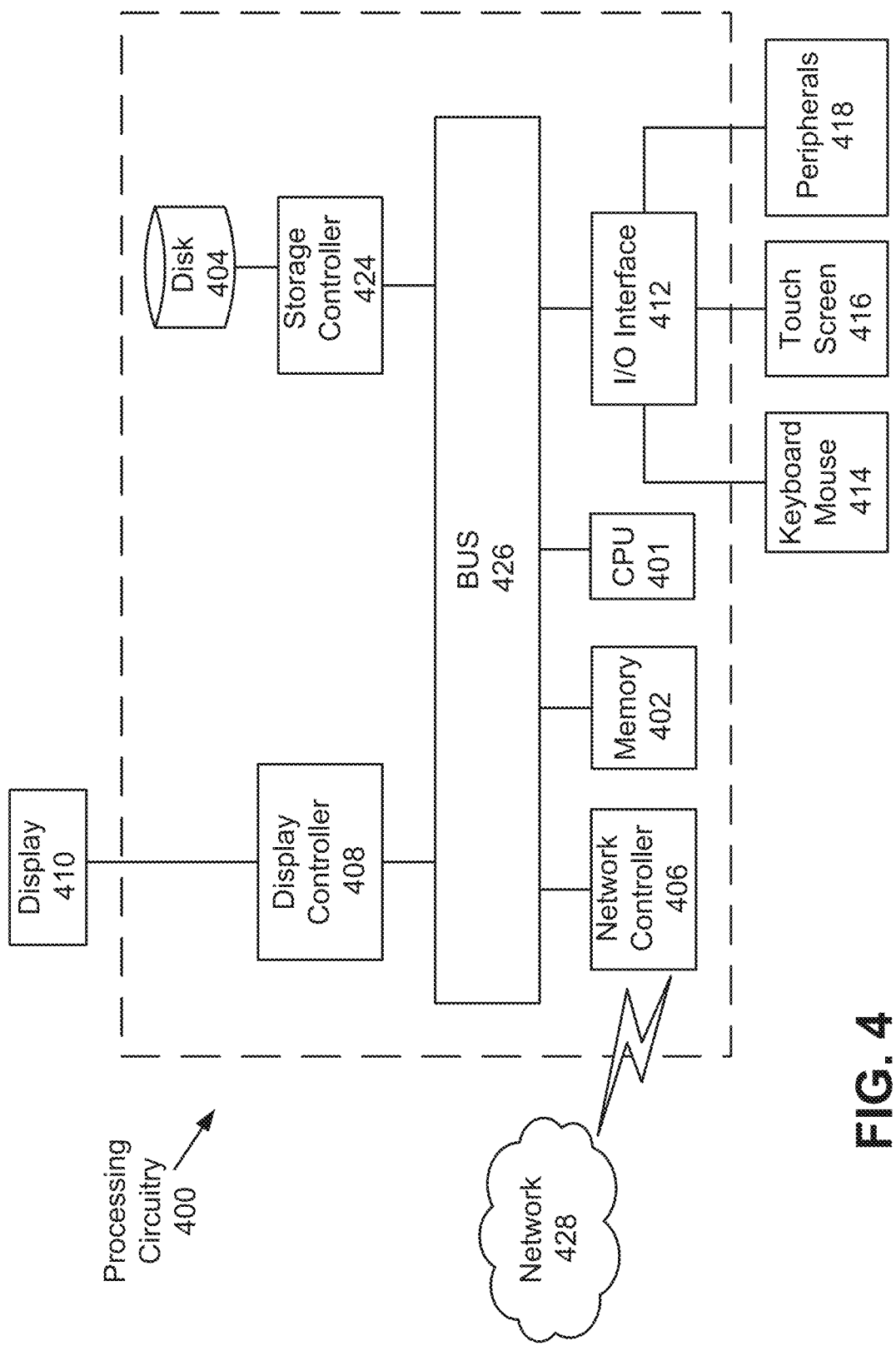
FIG. 4 illustrates exemplary processing circuitry that performs computer-based operations in accordance with the present disclosure.

A controller 260, in this example is a microcontroller, although a computer (local dedicated computer, or distributed computer) and/or processing circuitry such as that described in FIG. 4 may be used as an alternative of controller circuitry that is configured by computer code to perform control operations described herein.

Figure 3:
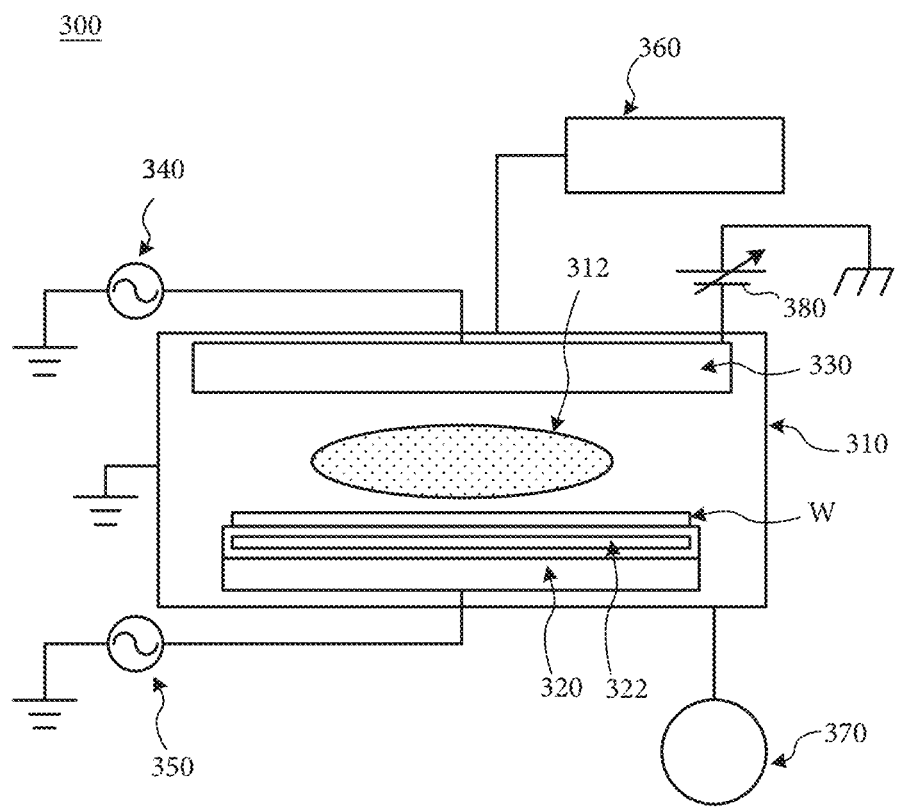
FIG. 3 illustrates an etching apparatus of the exemplary substrate processing system.

FIG. 3 schematically illustrates a etching apparatus 300, e.g., a capacitively coupled plasma (CCP) plasma system, that couples to the transfer device via a gate valve. While a CCP system is shown as an example, any other etching apparatus may also be used, such as inductively coupled plasma (ICP) apparatus and the like. The etching apparatus 300 includes a reaction chamber 310, which is approximately cylindrical in shape and formed of, for example, aluminum. The reaction chamber 310 is connected to ground potential. A film having plasma resistance is formed on the inner wall surface of the reaction chamber 310, and may be a film formed by an anodic oxidation treatment or a ceramic film, such as a film formed of yttrium oxide. When RF power is supplied to at least one of the upper electrode 330 and base 320 (serving as a lower electrode for generating plasma in the reaction chamber 310), a plasma 312 is developed between the upper electrode 330 and the base 320, with a substrate W to be processed therebetween. The plasma 312 is formed proximate to the substrate W, and the substrate W is held on an upper surface of an electrostatic chuck 322 as will be discussed in more detail below. The base 320 has an approximately disc shape and is conductive.

A gas source 360 includes a plurality of gas sources that are controlled via a corresponding series of flow rate controllers. The gas source 360 provides the gases via one or more gas lines to the reaction chamber 310.

The etching apparatus 300 further includes a first RF power supply 340 that generates RF energy in an inclusive range of 27 MHz through 100 MHz, with 60 MHz being an exemplary frequency. The first RF power supply 340 is connected to the upper electrode 330 through a matching circuit that matches an output impedance of the first RF power supply 340 and an impedance of the upper electrode 330.

The etching apparatus 300 further includes a second RF power supply 350 that generates RF energy for bias purposes so as to attract ions to the substrate W. An operational frequency of the second RF power supply 350 is lower than that for the first RF power supply 340, typically in a range of 400 kHz to 13.56 MHz. In an alternate embodiment, multiple RF power supplies 340 and 350 may be coupled to the same electrode (lower electrode 320).

The upper electrode 330 has a second power supply, which is a variable direct current (DC) power supply 380. The variable DC power supply 380 may also serve as a DC bias for the RF energy applied to the upper electrode from the first RF power supply 340. The variability of the DC power supply 380 allows for operational control over ion energy such that etch rates are controllable depending on the process being performed.

The RF energy generated by RF power supply 350 may be pulsed. When bias electric power is supplied to the base/lower electrode, etching mainly occurs. When bias electric power is not supplied to the base/lower electrode, deposition mainly occurs. A pulsed bias allows to separate the etch phase from the deposition phase. Etching occurs after a protective film is formed, and the sidewall of the recess is protected from side etch. Additionally, a change of duty of the pulse (bias on time/(bias on time+bias off time)) can control an etch/deposition balance. A longer bias off time can form protective film thicker, which leads to more protection. A longer bias on time increases an etch rate.

In an embodiment, the etching apparatus 300 may have dedicated control circuitry (e.g., processing circuitry such as that in FIG. 4) that operates exclusive of in or collaboration with the controller 260 (FIG. 2). The controller 260 executes a control program stored in memory, and controls each component of the etching apparatus 300 based on recipe data stored in the storage device.

The etching apparatus 300 includes an exhaust device 370 that is connected to an internal atmosphere of the reaction chamber 310. The exhaust device 370 includes a pressure controller, such as an automatic pressure control valve, a vacuum pump (e.g., turbo molecular pump), so as to controllably depressurize the reaction chamber 310 and exhaust gases from the reaction chamber 310.

FIG. 4 is a block diagram of processing circuitry for performing computer-based operations described herein. FIG. 4 illustrates processing circuitry 400 that may be used to control any computer-based and cloud-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 4, the processing circuitry 400 includes a CPU 401 which performs one or more of the control processes described above/below. The process data and instructions may be stored in memory 402. These processes and instructions may also be stored on a storage medium disk 404 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 400 communicates, such as a server or computer. The processes may also be stored in network based storage, cloud-based storage or other remote accessible storage and executable by processing circuitry 400.

Further, the claimed advancements may be provided as a utility application, background daemon, or component of an operating system, or combination thereof, executing in conjunction with CPU 401 and an operating system such as Microsoft Windows, UNIX, Solaris, LINUX, Apple MAC-OS and other systems known to those skilled in the art.

The hardware elements in order to achieve the processing circuitry 400 may be realized by various circuitry elements. Further, each of the functions of the above described embodiments may be implemented by circuitry, which includes one or more processing circuits. A processing circuit includes a particularly programmed processor, for example, processor (CPU) 401, as shown in FIG. 4. A processing circuit also includes devices such as an application specific integrated circuit (ASIC) and conventional circuit components arranged to perform the recited functions.

In FIG. 4, the processing circuitry 400 includes a CPU 401 which performs the processes described above. The processing circuitry 400 may be a general-purpose computer or a particular, special-purpose machine. In one embodiment, the processing circuitry 400 becomes a particular, special-purpose machine when the processor 401 is programmed to perform ESC in-situ replacement by controlling voltages and robot arms to replace the ESC without exposing the reaction chamber 310 to an external atmosphere. The processing circuitry 400 may be in or locally communicable to substrate processing apparatus 200. In some embodiments, processing circuitry 400 may be remote from substrate processing apparatus 200, providing processing instructions to substrate processing apparatus 200 via network 428.

Alternatively, or additionally, the CPU 401 may be implemented on an FPGA, ASIC, PLD or using discrete logic circuits, as one of ordinary skill in the art would recognize. Further, CPU 401 may be implemented as multiple processors cooperatively working in parallel to perform the instructions of the inventive processes described above.

The processing circuitry 400 in FIG. 4 also includes a network controller 406, such as an Intel Ethernet PRO network interface card from Intel Corporation of America, for interfacing with network 428. As can be appreciated, the network 428 can be a public network, such as the Internet, or a private network such as an LAN or WAN network, or any combination thereof and can also include PSTN or ISDN sub-networks. The network 428 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 400 further includes a display controller 408, such as a graphics card or graphics adaptor for interfacing with display 410, such as a monitor. A general purpose I/O interface 412 interfaces with a keyboard and/or mouse 414 as well as a touch screen panel 416 on or separate from display 410. General purpose I/O interface also connects to a variety of peripherals 418 including printers and scanners.

The general-purpose storage controller 424 connects the storage medium disk 404 with communication bus 426, which may be an ISA, EISA, VESA, PCI, or similar, for interconnecting all of the components of the processing circuitry 400. A description of the general features and functionality of the display 410, keyboard and/or mouse 414, as well as the display controller 408, storage controller 424, network controller 406, and general purpose I/O interface 412 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Figure 5:
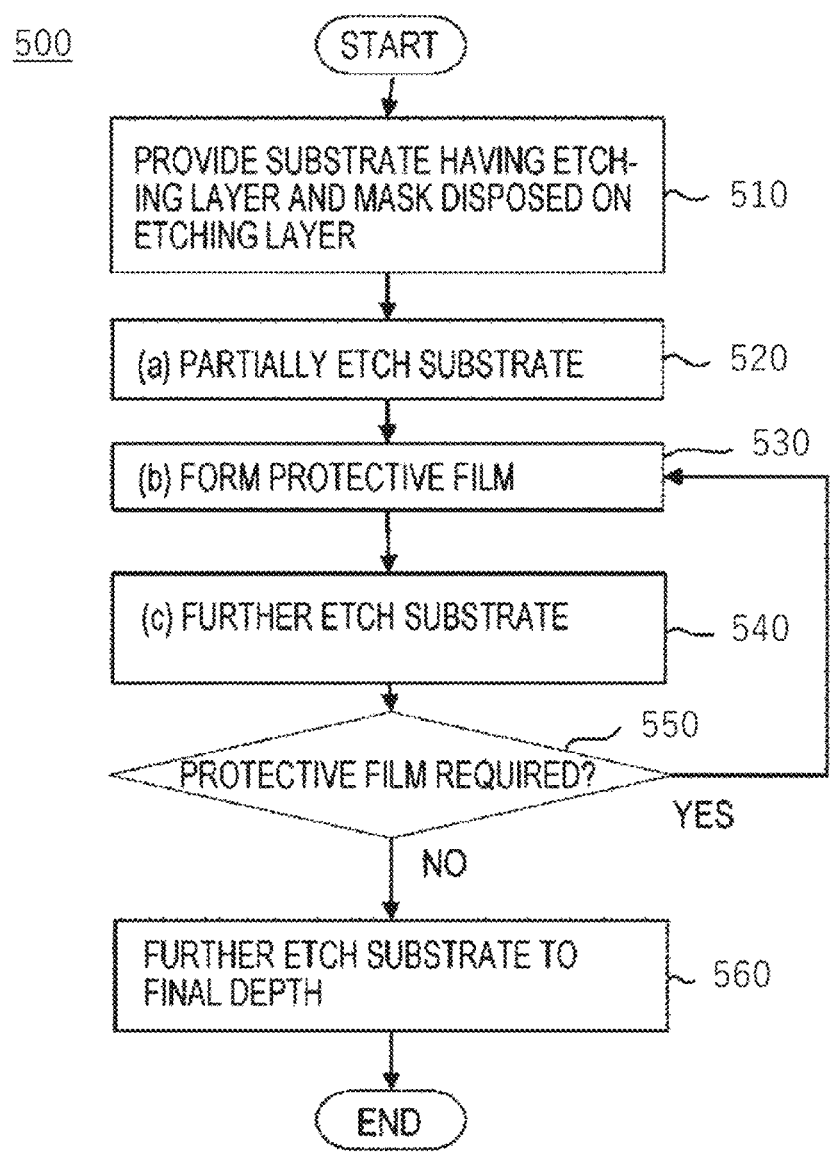
FIG. 5 is a flowchart of an exemplary etching method.

FIG. 5 is a flowchart of an exemplary etching method in accordance with the present disclosure. FIG. 5 will be discussed with reference to FIGS. 6A to 6C, which illustrate a etched recess when a protective film of a sub-conformal ALD is used.

The etching method begins at step 510, where a substrate having an etching layer 610 and a mask 620 disposed on the etching layer 610 is provided. The substrate having the etching layer 610 and the mask layer 620 may be substrate W discussed with respect to FIGS. 2 and 3. For example, processing circuitry 400 may control transfer device 240 to transport substrate W to the etching systems.

At step 520, processing circuitry 400 controls the etching system to partially etch the etching layer to form a recess in the etching layer 610 through opening of the mask 630. A plasma or other etching gas may be used for the etching in this step, as discussed above with respect to plasma 312. In step 520, a known etch method may be used. A plasma is generated from the etching gas and electric bias is supplied to the substrate to draw ions from the plasma.

At step 530, processing circuitry 400 controls etching apparatus 300 to form a protective film 640 on the sidewalls of the recess in etching layer 610. To form the protective film 640, precursor particles are first adsorbed upon the sidewall surface of the recess in etching layer 610. The precursor may be adsorbed either by generating plasma of a precursor gas or without generating plasma. The precursor particles are then exposed to a modification gas to form the protective film 640.

Formation of the protective film 640 may be performed by a traditional ALD based process or a sub-conformal ALD process. The traditional ALD based process will be discussed later with respect to FIGS. 9A to 9C.

The following are two aspects of a sub-conformal ALD process:

(1) A precursor may be adsorbed onto an entire surface of the substrate. The surface of the substrate includes the surface of the recess (the sidewall and the bottom of the etched recess). After adsorption of the precursor, a modification gas is controlled to be supplied for a relatively short period of time. Due to this controlled supply of the modification gas, for example, it becomes difficult for the O* radicals generated from the modification gas to reach a lower part and a bottom part of the recess and, as a result, fewer O* radicals reach the lower part and the bottom part of the recess.

(2) A precursor is adsorbed onto only a portion of the surface of the substrate. A modification gas introduced thereafter forms a film only on the portion of the surface onto which the precursor was adsorbed. For example, the precursor may be supplied for a relatively short time and a pressure and a flow rate of the precursor may be reduced.

In the formation of protective film 640, a precursor is supplied into the reaction chamber and the precursor is adsorbed onto the side wall of the recess. After the precursor is adsorbed onto the recess, the modification gas (such as O2 gas) and inhibitor gas are supplied into the reaction chamber. Precursor particles disposed on the substrate combine with the modification gas supplied into the reaction chamber. In an exemplary implementation, Si-containing precursor particles from an Si-containing precursor gas are disposed on the sidewall, and are then combined with O* radical from the modification gas to form an $SiO_x$ protective layer by oxidizing the Si-containing precursor particles on the sidewall. This may be repeated until a controlled thickness of the protective layer is achieved.

In some embodiments, an inhibitor gas and a modification gas are provided during a modification stage of step 530 but not during the adsorption stage of step 350. In other embodiments, an inhibitor gas and a modification gas are provided throughout step 530. In a case that the inhibitor gas is a fluorine-containing gas, fluorine species from the fluorine containing gas adheres to a periphery of the mask opening, and hinders the adsorption of a precursor of a next iteration of the process. Thus, a thickness of the protective film may be gradually reduced along the sidewall of the recess so that the film formation amount at the opening of the mask is reduced and clogging at the opening is suppressed.

In some embodiments, an electric bias may be supplied to the substrate in step 530. The electric bias may be smaller than the electric bias in etching steps 520 and 540. Further details of the adsorption, modification and purging stages of step 530 and the formation of the protective film 640 are discussed below with respect to FIGS. 7A to 7C.

By using a method with steps (1) or (2) described above at step 530, the protective film 640 is formed to have a thickness which is gradually reduced downward on the side wall of the recess in etching layer 610 when plasma is generated from the modification gas and the adsorbed precursor is exposed to the plasma to drive a surface reaction. Supply of the fluorine inhibitor gas and the modification gas during the adsorption and/or modification stages hinders the adsorption of the precursor at the mask opening.

The sequence (cycle) for forming the protective film 640 in step 530 is repeated until the controllable, predetermined film thickness is obtained. Thus, an integrity of the critical dimension of the recess is maintained with the assistance of the protective film on the sidewalls of the recess protecting the sidewalls from becoming bowed, which is a problem of associated with conventional etch processes.

After formation of the protective film 640, the process proceeds to step 540, where the substrate is further etched as in step 520.

At step 550, the processing circuitry 400 determines whether additional protective film 640 is required to further protect the sidewalls before a subsequent etching step is performed. The processing circuitry 400 determines whether additional protective film 640 is required based on analysis (e.g., transverse or scanning electron microscope inspection, TEM or SEM) of a number of trial substrates that are processed according to this method. Once a number of cycles is identified that results in the predetermined thickness, the process is recorded in a process recipe that is used to program the processing circuitry 400 to control the deposition/etching steps for processing substrates in subsequent process batches.

If an insufficient amount of protective film 640 remains on the sidewalls to protect the sidewalls during a subsequent etching step (yes at step 550), then the process returns to step 530, where additional protective film is formed on the sidewalls. However, if in step 550 it is determined that the amount of protective is sufficient to protect the sidewalls during further etching until a final depth is reached (no at step 550), the process proceeds to step 560, where the etching continues until the final depth is achieved.

The determination at step 550 may be performed by processing circuitry 400 according to a process in which processing circuitry 400 determines whether additional iterations of the etching process need to be performed based on whether a predetermined etching time has been satisfied. To do so, the processing circuitry 400 may keep track of a cumulative etching time of the etching performed in step iterations of step 540 and compare the cumulative etching time to the predetermined etching time. Therefore, the processing circuitry 400 keeps track of the cumulative etching time will know whether additional etch steps may be performed without further supplementing the protective film on the sidewalls of the recess.

At step 560, the process concludes by further etching the etching layer 610 of the substrate to its final depth. Thus, steps 530, 540 and 550 are repeated a predetermined number of times, where the determination at step 550 may be decided based on a number of iterations that have been performed under same process conditions that were present when manufacturing the trial substrates.

In one exemplary implementation, the processing circuitry 400 controls at least steps 520-560 to be performed within reaction chamber 310. In another implementation, the processing circuitry 400 controls the protective film 640 to be formed in one reaction chamber, and the etching to be performed in another reaction chamber.

In yet another implementation, the processing circuitry controls the initial etching to be performed in a first reaction chamber and the further, repeated etching to be performed in a second reaction chamber. The formation of the protective film may be formed in the first reaction chamber, the second reaction chamber or in a third reaction chamber.

In an exemplary implementation of this disclosure, after performance of the process illustrated in FIG. 5, a critical dimension (CD) of a middle region of the sidewall in a vertical direction after the protective film is formed to be smaller than a CD of an upper portion of the sidewall. Moreover, a film thickness of the protective film formed on the upper portion of the recess is smaller than a maximum film thickness of the protective film formed on the sidewall of the recess in etching layer.

In another exemplary implementation of this disclosure, after performance of the process illustrated in FIG. 5, a CD of a film formation amount may be reduced in a lower or middle portion of the sidewall of the recess by using a different type of inhibitor gas. The film formation amount may be reduced in the lower or middle portion of the sidewall of the etched recess by changing a species of CxFy gas.

FIGS. 6A to 6C illustrate the substrate undergoing the process illustrated in FIG. 5. In particular, FIG. 6A shows partial etching through opening 630 of the mask 620 to generate a recess in etching layer 610.

FIG. 6B shows the formation of protective film 640 upon sidewalls of the recess in etching layer 610. The protective film 640 is generated by (1) adsorbing precursor particles upon the sidewall surface of the recess in etching layer 610, (2) purging gas within the reaction chamber, (3) converting the precursor to a protective film by supplying a modification gas and an inhibitor gas, and (4) again purging gas within the reaction chamber. The precursor particles be adsorbed either by generating plasma of a precursor gas or without generating plasma. The purging of gas within the reaction chamber may be an optional step.

FIG. 6C shows a further etching through opening 630 of the mask 620 to generate a recess in etching layer 610. Due to the formation of protective film 640, the recess in FIG. 6C does not result in a bowed shape due to reducing of lateral etching.

As discussed with respect to FIG. 5, the formation of protective film 640 and the further etching of the substrate may be repeated until a final depth of the recess within etching layer 610 is obtained.

There are no limitations on material for etching layer 610. For example, etching layer 610 may include a Si-containing film, a Si-containing dielectric film such as SiOx or SiN. Examples of the Si-containing dielectric film may include alternately-stacked layers of SiOx and SiN (ONON stack) and alternately-stacked layers of SiOx and poly Si (OPOP stack). The etching layer 610 may further include an organic film. The aspect ratio of the recess may be 10 to 20 or more, or 30 or more.

The table below lists some combinations of materials for the etching layer, the mask, and the etching gas:

| Etching Layer | Mask | Main Etching Gas |
| --- | --- | --- |
| Si-containing dielectric film (e.g., SiOx and SiN) | amorphous carbon, metal-containing film (e.g., TiN, WC, W, and Mo) | CxFy, CtHwFu, etc. |
| Poly Si | $SiO_2$ | $Cl_2$, HBr |
| Organic film | SiON, $SiO_2$, Si-ARC (Si-antireflective coating) | Oxygen containing gas $O_2$, $CO_2$, CO gas |

However, there are no material limitations for the etching layer, the mask and the main etching gas.

In another exemplary implementation of this disclosure, the etching layer 610 such as organic film may be etched by plasma generated from oxygen containing gas during the formation of protective film 640.

Figure 7A:
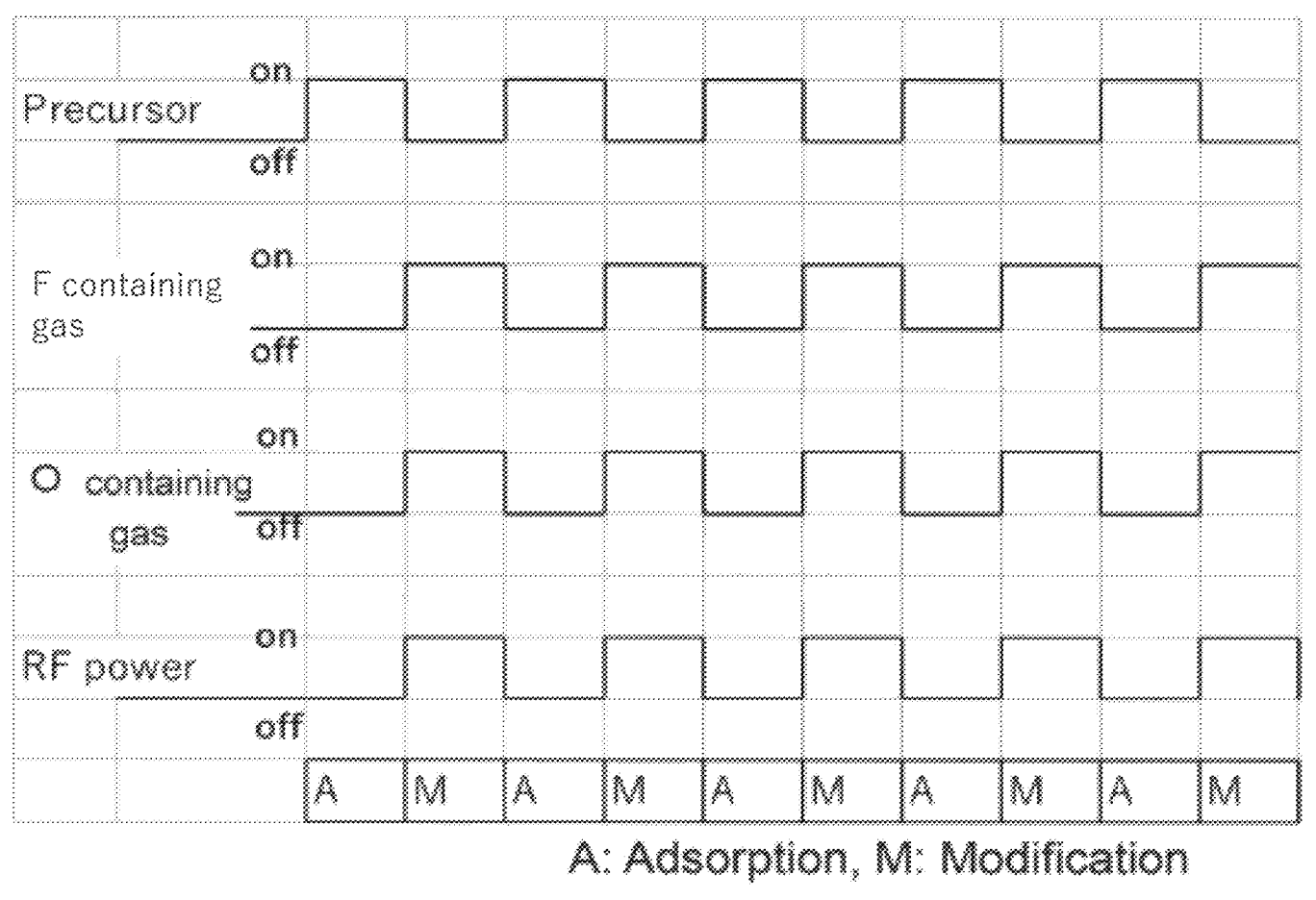
Figure 7B:
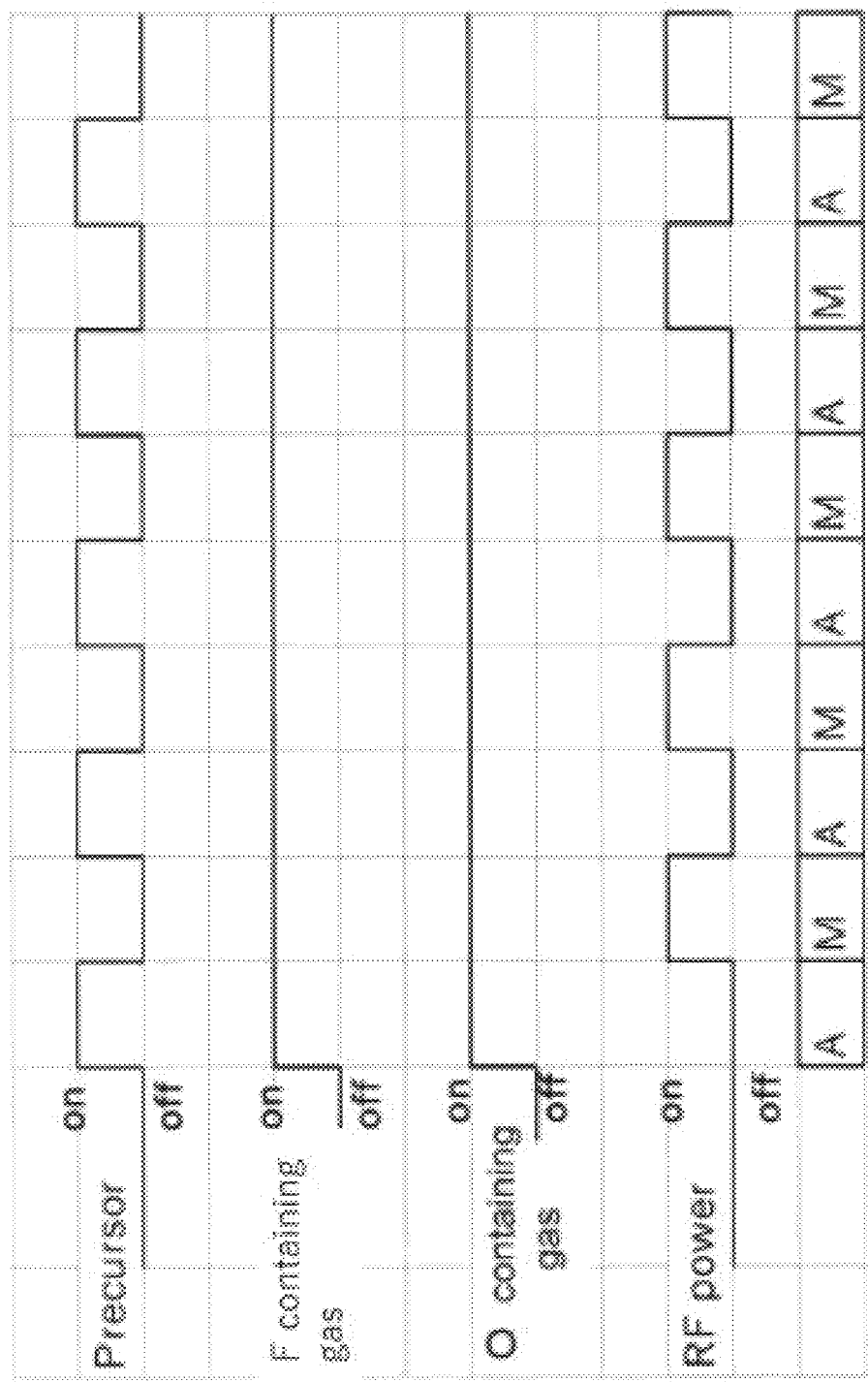
Figure 7C:
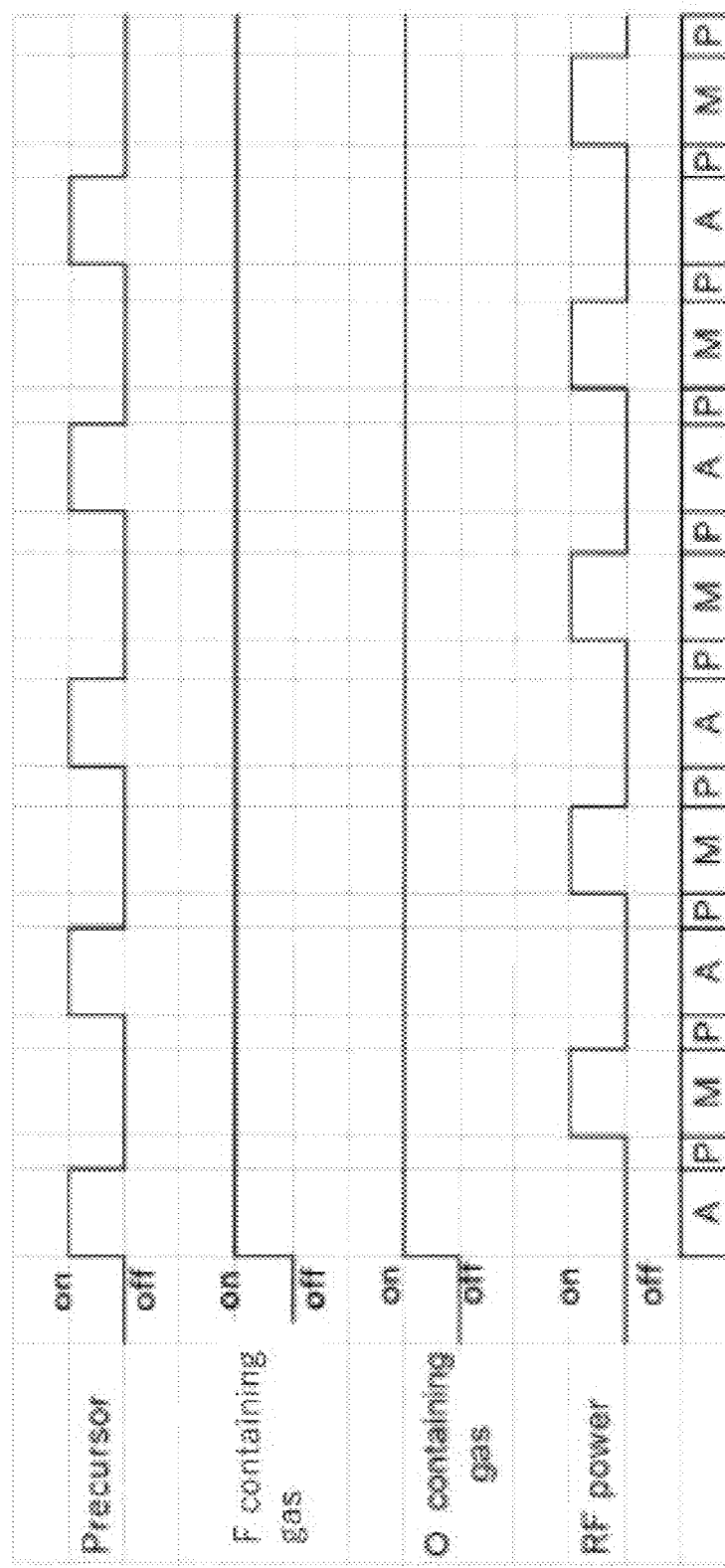

FIGS. 7A to 7C illustrate exemplary timing charts for the formation of a protective film.

FIG. 7A illustrates a first timing chart in which a precursor is applied to the substrate before application of RF power, fluorine containing gas and O containing gas. In particular, the precursor is adsorbed onto a surface of the substrate during an adsorption period A. After the adsorption period is completed, the provision of the precursor ends and the fluorine containing gas and oxygen containing gas are supplied during the modification period M. In particular, during the modification period M (in step 530), a protective film is formed by a surface reaction between the precursor layer and a plasma of the modification gas, and an inhibitor is formed on the upper end of the pattern (near the mask opening) by gaseous inhibitor, for example F-containing plasma from the fluorine containing gas. Thus, a precursor of a subsequent cycle is hardly adsorbed onto the upper end of the pattern (near the mask opening), which results in a reduced film formation of the protective film at an upper end of the pattern.

The supply of RF is synchronized with the supply of oxygen containing gas and fluorine containing gas. After completion of the modification period, a new adsorption period A may begin. Adsorption and modification periods may be performed a plurality of times in alternating fashion.

Purging of the inside of the chamber may be performed between adsorption and modification, and/or after modification.

In some embodiments, based on the type of precursor used during the adsorption step, RF may be supplied during both the adsorption and the modification periods.

FIG. 7B illustrates a second timing chart in which fluorine containing gas and oxygen containing gas are continuously provided during both the adsorption and modification periods. In particular, fluorine containing gas and oxygen containing gas gases are provided at the beginning of the adsorption period when the precursor is adsorbed onto the surface of the substrate. The fluorine containing gas and oxygen containing gas are continuously supplied throughout the adsorption period and then throughout the modification period when the RF is supplied. Adsorption and modification periods may be performed a plurality of times in alternating fashion, throughout which the fluorine containing gas and oxygen containing gas are continuously supplied.

In another exemplary implementation, the fluorine containing gas or the oxygen containing gas may be intermittently supplied while the RF is supplied.

Purging of the inside of the chamber may be performed between adsorption and modification, and/or after modification.

FIG. 7C illustrates a third timing chart of an exemplary process in which purging is performed between the adsorption and modification periods and after the modification period. In this exemplary process, the reaction chamber may be held to a chamber pressure of 10 mTorr during formation of the protective film. This chamber pressure is exemplary, and the chamber pressure may be held at other static or dynamic pressures.

As illustrated in FIG. 7C, the precursor is initially applied during an adsorption period. In this exemplary process, the precursor may be amino-silane supplied at 20 sccm for an adsorption period length of 2 seconds. However, the precursor may be other material combinations and supplied at a different flow rate. Moreover, the adsorption period may last for a different length of time.

At the start of the adsorption period, fluorine containing gas and oxygen containing gas are also supplied. A continuous supply of fluorine containing gas and fluorine containing is provided. In this exemplary process, the fluorine containing gas (for example, CF4) is supplied continuously at 100 sccm and oxygen containing gas (O2 gas) is supplied continuously at 300 sccm. However, other forms of fluorine containing gas and oxygen containing gas may be provided and at different flow rates.

At the conclusion of the adsorption period, a first purging period is performed to purge the reaction chamber of the fluorine containing gas and the oxygen containing gas. In the exemplary process, the first purging period has a length of 1.5 seconds. However, the first purging period may last for a different length of time. The supply of fluorine containing gas and the oxygen containing gas may be continuously provide throughout the first purging period. Alternatively, the supply of the fluorine containing and the oxygen containing gas may be paused at the start of the first purging period and restarted at the end of the first purging period.

At the conclusion of the first purging period, a modification period is performed in which RF power is provided. fluorine containing gas and oxygen containing gas are continuously supplied throughout the modification period. In the exemplary process, the modification period has a length of 1 second. However, the modification period may last for a different length of time. In this exemplary process, the RF power may be supplied at 60 MHz in a continuous wave or a pulsed wave with a frequency of 20 kHz. However, other RF power values, wave styles and frequencies may be utilized.

At the conclusion of the modification period, a second purging period is performed to purge the reaction chamber of the fluorine containing gas and the oxygen containing gas. In the exemplary process, the second purging period has a length of 1 second. However, the second purging period may last for a different length of time. The supply of fluorine containing gas and the oxygen containing gas may be continuously provided throughout the second purging period. Alternatively, the supply of the fluorine containing gas and the oxygen containing gas may be paused at the start of the second purging period and restarted at the end of the second purging period.

At the conclusion of the second purging period, the cycle may restart with a next adsorption period. Cycles of the exemplary process may be performed until a controlled thickness of the protective film is achieved. In one example, 50 cycles of the adsorption/first purge/modification/second purge may be performed to achieve a controlled thickness of the protective film.

Figure 8:
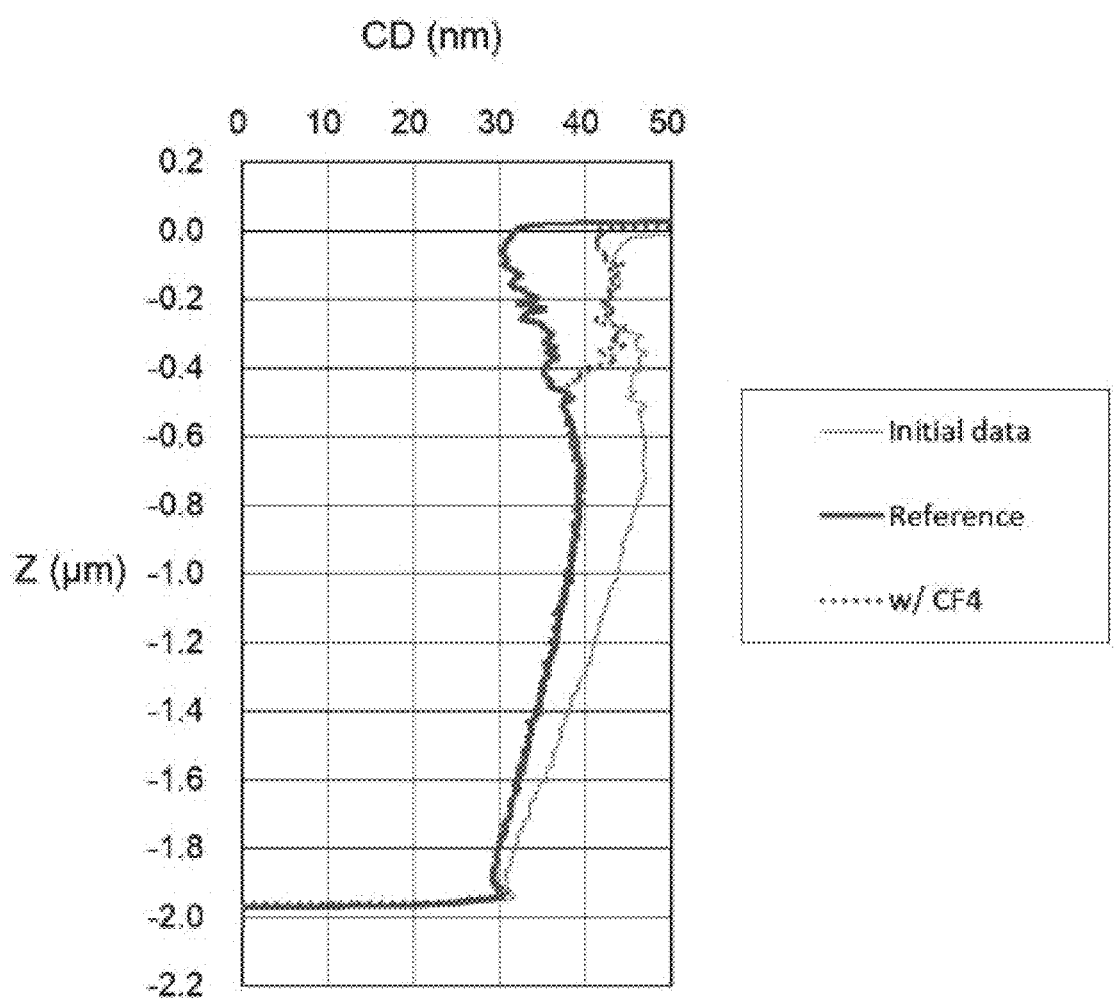
FIG. 8 illustrates the effects of an embodiment of the present disclosure on a protective film thickness at an opening of the mask.

FIG. 8 illustrates the effects of an embodiment of the present disclosure on a CD of a sidewall at an opening of the mask. In particular, FIG. 8 illustrates a depth Z (measured in μm from a surface of the mask to a bottom of the recess and with 0 being the opening of the mask) of the recess with respect to CD (measured in nm) of the recess. FIG. 8 further illustrates data from an etched ("initial") substrate, a reference ("reference") substrate with a conventional sub-conformal ALD process, and substrate with a sub-conformal ALD process according to the present disclosure in which CF4 is provided throughout forming the protective film ("w/CF4").

As illustrated in FIG. 8, the CD of the sidewall changes at different rates you get closer to the opening of the mask (depth approaching 0) with respect to the sub-conformal ALD process applied.

The initial substrate is a substrate in a state after an etching is performed with a fluorocarbon gas or the like, and before a subconformal ALD deposition is performed.

In the reference substrate, the CD decreases in a middle to upper part of the sidewall as the opening of the mask is approached (−0.5 μm to 0 μm). This is due to an increased thickness of the protective film as a result of the conventional sub-conformal ALD process.

In contrast, when CF4 is supplied during the sub-conformal ALD process in accordance with the present disclosure, the CD (w/CF4) of the recess continues to increase in the middle to upper part of the sidewall as the opening of the mask is approached (−0.5 μm to 0 μm).

Thus, as illustrated in FIG. 8, the application of a sub-conformal ALD process, with the provision of CF4 throughout the sub-conformal ALD process, results in the formation of a protective film with a controlled reduction in a thickness of the protection film formed on the mask. By adding CF4 in the ALD (sub-conformal ALD) process, the film formation amount at the opening of the mask may be reduced, so that the clogging of the opening is suppressed as compared to the reference sub-conformal ALD process in which fluorine containing gas (for example, CF4) is not provided throughout.

In particular, a thicker film is formed on a portion where a side-etching easily occurs (e.g., right below a mask) and a thinner film is formed on the mask. As a result, the reduction of the mask opening is suppressed and the distribution of the film thickness is controlled, thereby improving the shape of the recess.

Further, the present disclosure provides a technique of etching where a film is formed to be thick on a portion where the side etching likely occurs and to be thin on other portions, e.g. the mask and/or bottom of the recess. Additionally, in the sub-conformal ALD process according to the present disclosure, it is possible to broaden a diameter of the bottom of a recess by an over-etching while suppressing an occurrence of bowing of the recess due to side etching.

Figure 9A:
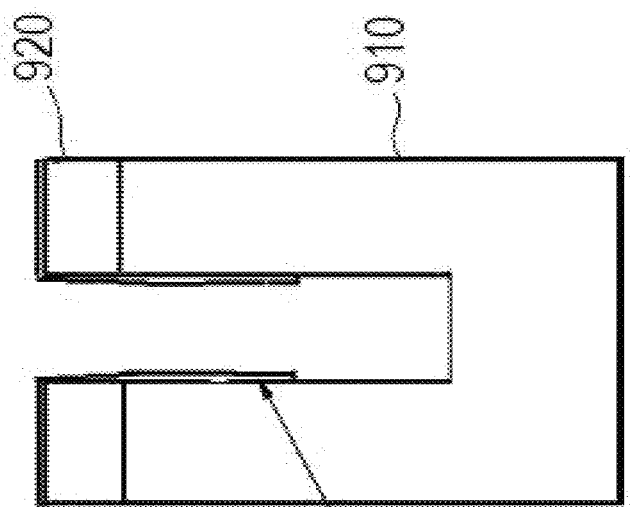
FIGS. 9A to 9C illustrate another embodiment of the present disclosure in which a protective film is also formed on a bottom surface of the recess in the etching layer.
Figure 9B:
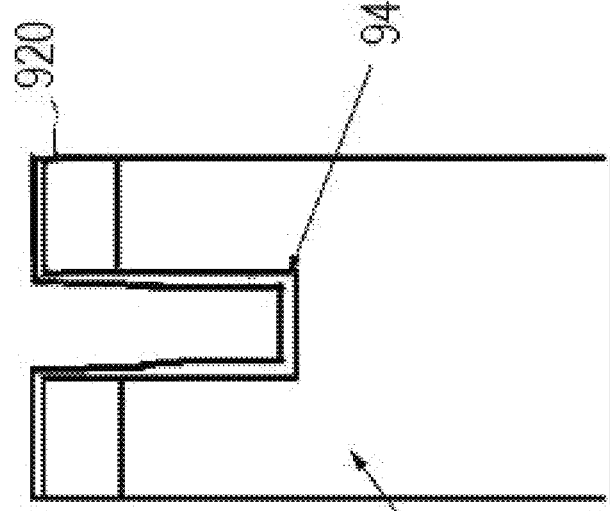
Figure 9C:
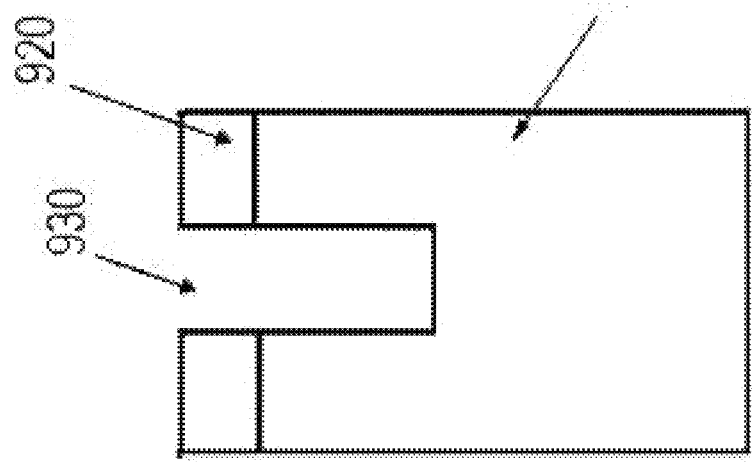

FIGS. 9A to 9C illustrate another embodiment of the present disclosure in which an a protective film is formed on a bottom surface of the recess in the etching layer. A modified version of the process illustrated in FIG. 5 may be used to form the recess illustrated in FIGS. 9A to 9C.

In particular, at step 510, a substrate having an etching layer 910 and a mask 920 disposed on the etching layer 910 is provided. At step 520, processing circuitry 400 controls the etching apparatus 300 to partially etch the etching layer 910 through opening of the mask 930.

At step 530, processing circuitry 400 controls etching apparatus 300 to form a protective film 940 on the substrate. In this case, the processing circuitry 400 controls the etching apparatus 300 to form the protective film 940 on the sidewalls of etching layer 910 as well as a bottom surface of the recess. At step 540, the substrate is further etched as in step 520 in order to etch through the bottom surface of the protective film and to further etch the etching layer 910 to increase a depth of the etching layer. At step 550, the processing circuitry 400 determines whether additional protective film 940 is required in order to satisfactorily protect the sidewalls of the recess. As recognized by the inventors, the existence of the protective layer is effective at protecting the side wall of the recess in a Si-containing layer from being removed by ion attack with relatively low energy. On the other hand, ions incident on the bottom of the recess have a higher energy and thus remove (etch) the bottom of the recess even when the protective layer is formed on the bottom of the recess. Thus, the protective layer preferentially protects against undesired sidewall etch because the protective layer is sufficiently chemically strong enough to avoid being removed by lower energy ions that impart a glancing blow on the sidewall, while higher ions that bombard the bottom of the recess via a direct impact are sufficiently high in energy to etch through the protective layer at the bottom of the recess. In turn, this allows for etching higher aspect ratio recesses with sidewall-bowing suppression.

When additional protective film 640 is required (yes at step 550), the process returns to step 530. When additional protective film 640 is not required (no at step 550), the process proceeds to step 560. At step 560, the process concludes by further etching the etching layer 910 of the substrate to its final depth.

As discussed above with respect to FIGS. 5 and 6A to 6C, the protective film 940 is generated by (1) adsorbing a precursor upon the sidewall surface and a bottom surface of the recess in etching layer 910, (2) purging gas within the reaction chamber, (3) converting the precursor to a protective film, and (4) again purging gas within the reaction chamber. The precursor may be adsorbed either by generating plasma of a precursor gas or without generating plasma. The purging of gas within the reaction chamber may be an optional step. Additionally, the inhibitor gas and modification gas may be applied continuously during the purge, or may be stopped before the purge and then restarted after the purge. In another example, in either sub-conformal ALD or ALD, after the precursor is adsorbed, plasma may be generated from the modification gas (e.g., oxygen-containing gas), and the modification may be performed. Thereafter, the inhibitor gas may be supplied to form a plasma, and the plasma may be exposed to the substrate.

In an exemplary implementation to form the protective film 940 in FIGS. 9A to 9C, a supply time and/or modification time of the precursor is longer than a supply time and/or modification time of the precursor in a sub-conformal ALD process as described with respect to the formation of protective film 640 in FIGS. 6A to 6C.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

ELEMENT REFERENCE NUMERALS

W Substrate
100 Substrate
110 Under lying layer (base layer)
120 Etching layer
130 Mask
140 Bowing (side etch)
200 Substrate processing apparatus
212, 214, 216, 218 Load ports
220 Loader
222 Loader robot
232, 234 Load lock chamber
240 Transfer device
242 Transfer robot
252, 254, 256, 300 Etching system
258 Stocker/changer
260 Controller
310 Reaction chamber
312 Base
320 Upper electrode
322 Electrostatic chuck
330 Upper electrode
340 RF power supply
350 RF power supply
360 Gas source
370 Exhaust device
380 DC power supply
400 Processing circuitry
401 CPU
402 Memory
404 Disk
406 Network controller
408 Display controller
410 Display
412 I/O interface
414 Keyboard/Mouse
416 Touch screen
418 Peripherals
424 Storage controller
426 Communication Bus
428 Network
610 Etching layer
620 Mask
630 Opening of the mask
640 Protective film
910 Etching layer
920 Mask
930 Opening of the mask
940 Protective film

What is claimed is:

1. A method of forming a film on a substrate, the substrate including an etching layer and a mask formed on the etching layer, the method comprising:
    (a) exposing the substrate, in a reaction chamber, to a precursor to dispose precursor particles on at least a sidewall of a recess in the etching layer;
    (b) supplying an inhibitor gas and a modification gas to the reaction chamber to generate a plasma; and
    (c) modifying the precursor particles on the sidewall into a protective film while the inhibitor gas and the modification gas are supplied in the reaction chamber, wherein
    the precursor is a Si-containing gas.

2. The method according to claim 1, further comprising (d) etching the substrate with the plasma after the (c) modifying.

3. The method according to the claim 1, wherein the (b) supplying of the inhibitor gas and the modification gas is performed continuously throughout the (a) exposing and the (c) modifying.

4. The method according to claim 1, wherein the (a) exposing is repeated following completion of the (c) modifying.

5. The method according to claim 1, wherein
    the (a) exposing the substrate to the precursor is performed to additionally dispose precursor particles on a bottom surface of the recess in the etching layer, and
    the (c) modifying includes modifying the precursor particles on the bottom surface of the recess into the protective film.

6. The method according to claim 1, wherein the inhibitor gas is a CxFy gas.

7. The method according to claim 6, wherein a film thickness of the protective film formed on an upper portion of the recess is smaller than a film thickness of a protective film formed on the upper portion of the recess under a condition that CxFy gas is not supplied.

8. The method according to claim 1, wherein a critical dimension (CD) of a middle region of the sidewall in a vertical direction after the protective film is formed is smaller than a CD of an upper portion of the sidewall.

9. The method according to claim 1, wherein a film thickness of the protective film formed on an upper portion of the recess is smaller than a film thickness of the protective film formed on a remainder of the sidewall.

10. The method according to claim 1, wherein the modification gas and the inhibitor gas are consecutively supplied.

11. The method according to claim 1, further comprising (e) purging inside of the reaction chamber.

12. The method according to claim 11, wherein the (e) purging is performed after the (a) exposing and then again after the (c) modifying.

13. The method according to claim 2, wherein the (d) etching includes applying a bias power to an electrode in the reaction chamber.

14. The method according to claim 1, wherein the (c) modifying includes providing a radio frequency (RF) to an electrode in the reaction chamber during the modifying in (c).

15. A method of forming a film on a substrate, the substrate including an etching layer and a mask formed on the etching layer, the method comprising:
    during a first time period:
        (a) exposing the substrate, in a reaction chamber, to a precursor to dispose precursor particles on at least a sidewall of a recess in the etching layer; and
    during a second time period:
        (b) supplying an inhibitor gas and a modification gas to the reaction chamber to generate a plasma; and
        (c) modifying the precursor particles on the sidewall into a protective film while the inhibitor gas and the modification gas are supplied in the reaction chamber, wherein
    the precursor is a Si-containing gas.

16. The method according to claim 15, wherein at least a part of the (b) supplying and the (c) modifying are performed at a same time during the second time period.

17. The method according to claim 15, further comprising providing a radio frequency (RF) in the (c) modifying.

18. A device for forming a film on a substrate, the substrate including an etching layer and a mask formed on the etching layer, the device comprising:
    processing circuitry configured to:
        control provision of a precursor to a reaction chamber, thereby exposing the substrate to dispose precursor particles on at least a sidewall of a recess in the etching layer;
        control gas sources to supply an inhibitor gas and a modification gas to the reaction chamber to generate a plasma; and
        control a radio frequency (RF) source to provide RF to modify the precursor particles on the sidewall into a protective film on the sidewall of the recess while the inhibitor gas and the modification gas are supplied in the reaction chamber, wherein
    the precursor is a Si-containing gas.

19. The device according to claim 18, wherein the inhibitor gas and the modification gas are continuously supplied throughout the provision of the precursor and modification of the precursor particles into the protective film.

20. The device according to claim 18, wherein the processing circuitry is further configured to control a gas exhaust to purge the inhibitor gas and the modification gas from the reaction chamber.

* * * * *